(12) United States Patent
Fukuda et al.

(10) Patent No.: US 6,995,501 B2
(45) Date of Patent: Feb. 7, 2006

(54) ULTRASONIC TRANSDUCER AND METHOD OF MANUFACTURING THE SAME

(75) Inventors: Hiroshi Fukuda, Hachioji (JP); Masayoshi Omura, Saitama (JP); Tohru Mizuguchi, Yamanashi (JP)

(73) Assignee: Olympus Corporation, Tokyo (JP)

( * ) Notice: Subject to any disclaimer, the term of this patent is extended or adjusted under 35 U.S.C. 154(b) by 22 days.

(21) Appl. No.: 10/437,635

(22) Filed: May 14, 2003

(65) Prior Publication Data

US 2004/0012307 A1    Jan. 22, 2004

(30) Foreign Application Priority Data

May 16, 2002    (JP) .............................. 2002-142093

(51) Int. Cl.
*H01L 41/193*    (2006.01)

(52) U.S. Cl. ...................................... 310/358; 310/334
(58) Field of Classification Search ................ 310/334, 310/358, 359, 367, 369

See application file for complete search history.

(56) References Cited

U.S. PATENT DOCUMENTS

| | | | | |
|---|---|---|---|---|
| 4,523,122 A | * | 6/1985 | Tone et al. .................. | 310/334 |
| 4,961,176 A | * | 10/1990 | Tanaka et al. .............. | 367/155 |
| 5,461,274 A | * | 10/1995 | Yuji et al. ................... | 310/330 |
| 6,791,240 B2 | * | 9/2004 | Mauchamp et al. ........ | 310/334 |

FOREIGN PATENT DOCUMENTS

| | | | | |
|---|---|---|---|---|
| JP | 59-197349 | * | 8/1984 | |
| JP | 3-214678 | * | 9/1991 | ................. 310/358 |
| JP | 2001-137238 | | 5/2001 | |

* cited by examiner

*Primary Examiner*—Thomas M. Dougherty
(74) *Attorney, Agent, or Firm*—Scully, Scott, Murphy & Presser

(57) ABSTRACT

Materials having different compositions are arranged to prepare a molded form in which the sound velocity characteristic is varied from high frequency to low frequency from the center toward the periphery. An ultrasonic wave-radiating face of the molded form and the back face of the ultrasonic wave-radiating face are arranged in parallel to each other to prepare a transducer in which the center region can transmit/receive high-frequency ultrasonic waves and the periphery region can transmit/receive low-frequency ultrasonic waves.

2 Claims, 6 Drawing Sheets

ULTRASONIC TRANSDUCER AND METHOD OF MANUFACTURING THE SAME

This application claims benefit of Japanese Application No. 2002-142093 filed on May 16, 2002, the contents of which are incorporated by this reference.

BACKGROUND OF THE INVENTION

1. Field of the Invention

The present invention relates to an ultrasonic transducer that includes a single transducer and can be used to transmit/receive broadband ultrasonic waves.

2. Related Art Statement

In the field of medical care, ultrasonic diagnostic equipment having the following function has been developed: ultrasonic pulses transmitted by an ultrasonic transducer are repeatedly applied to tissues, the echoes of the ultrasonic pulses reflected by the tissues are received with the ultrasonic transducer or another ultrasonic transducer, the direction that the ultrasonic pulses are transmitted or received is gradually varied, and information obtained in a plurality of directions of the tissues is converted into visible images to display ultrasonic images.

Among ultrasonic transducers used for ultrasonic probes for the ultrasonic diagnostic equipment, an ultrasonic transducer having the structure shown in FIG. 9 is conventionally known. Electrodes 42 are each disposed on both faces of an piezoelectric transducer 41 that has been polished so as to have a uniform thickness and has uniform composition, a matching layer 43 and an acoustic lens 44 are disposed on an ultrasonic wave transmitting/receiving face which is one of the above faces of the piezoelectric transducer 41 in that order, a backing layer 45 is disposed on the other face, and these components are housed in a housing 46. The electrodes 42 disposed on both faces of the piezoelectric transducer 41 are electrically connected to an observation unit via wiring lines and connectors which are not shown.

In general, in the observation of ultrasonic images obtained using such ultrasonic probes, high-frequency ultrasonic waves are used in many cases depending on the need that high-resolution is required even if penetration is sacrificed when shallow areas are observed, and low-frequency ultrasonic waves are used in many cases when high penetration is necessary. There is a request to observe ultrasonic images using a single probe while the ultrasonic wave frequency is varied. Therefore, in order to transmit/receive more broadband ultrasonic waves, the following elements have been proposed: a composite piezoelectric element 51, equipped with a resin layer 51a and minute piezoelectric sub-elements 51b arranged therein, having broadband characteristics, as shown in FIG. 10; and a so-called plano-concave transducer 61 including a piezoelectric material having a thickness gradient, as shown in FIG. 11.

SUMMARY OF THE INVENTION

An ultrasonic transducer of the present invention has such a configuration that material compositions are arranged from the periphery toward the center in ascending order of sound velocity such that the frequency of ultrasonic waves is varied depending on regions, and includes an ultrasonic wave-radiating face that is in parallel to the back face thereof.

DETAILED DESCRIPTION OF THE PREFERRED EMBODIMENTS

An ultrasonic transducer according to the present invention is formed in such a manner that piezoelectric materials or electrostrictive materials are mixed and then processed by a rapid heating sintering method. A transducer-forming method using a spark plasma sintering method, which is one of rapid heating sintering methods, is described below. The spark plasma sintering method has the following satisfactory advantages as compared with conventional heat sintering methods using heaters: the sintering time is short, the sintering temperature is low, materials having sintering resistance can be sintered without using sintering additives, porous sintered bodies having high strength can be readily prepared (the neck formability is high), and sintered bodies in which the internal composition and microstructure are gradually varied can be readily prepared (desired functional materials, such as metal-ceramic materials, having a functional gradient can be readily obtained).

Figure 1:
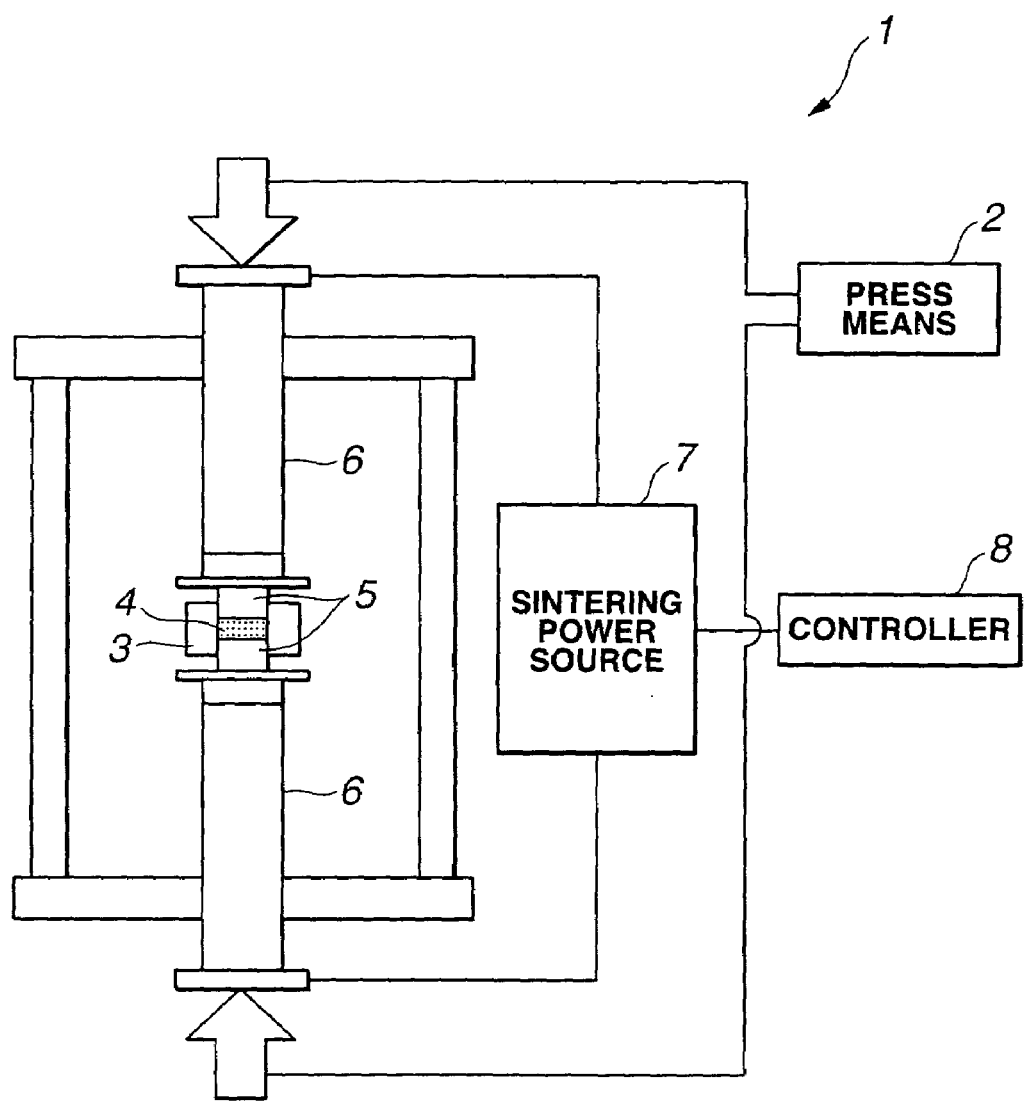
FIG. 1 is an illustration showing a configuration of a spark plasma sintering system.

As shown in FIG. 1, a spark plasma sintering system 1 includes a press means 2 similar to a hot press machine, press punches 5 for pressing powder 4 placed in a sintering die 3, punch electrodes 6 each connected to the corresponding press punches 5, a sintering power supply 7 for supplying electricity to the punch electrodes 6, and a controller 8 for controlling the press means 2 and the sintering power supply 7. The powder 4 placed in the sintering die 3 is a composite containing different compositions. This composite is pressed and rapidly heated, thereby obtaining a sintered compact having a functional gradient for the sound propagation velocity.

Next, a method for preparing such a sintered compact having the functional gradient using the following materials, shown in the following table, having different sound velocity characteristics and compositions will now be described: lead niobate A and lead titanate B.

|  | Sound velocity | Density |
| --- | --- | --- |
| Lead niobate A | 4500 | 7.4 |
| Lead titanate B | 3260 | 5.7 |

First, the following four powder materials having different compositions are prepared in order to form the sintered compact: a lead niobate A powder material, a lead titanate B powder material, a powder mixture in which the ratio of the lead niobate A powder material to the lead titanate B powder material is two to one, and another powder mixture in which the ratio of the lead niobate A powder material to the lead titanate B powder material is one to two. The lead niobate A powder material, which has relatively satisfactory high-frequency characteristics, is placed at the center, the other powder materials are arranged from the vicinity of the center toward the periphery in ascending order of the content of the lead titanate B powder material, and thereby a composite structure having the following compositions is formed: a composition, disposed at the center, having a large sound propagation velocity and the other compositions, disposed at the periphery, having a small sound propagation velocity.

Figure 2:
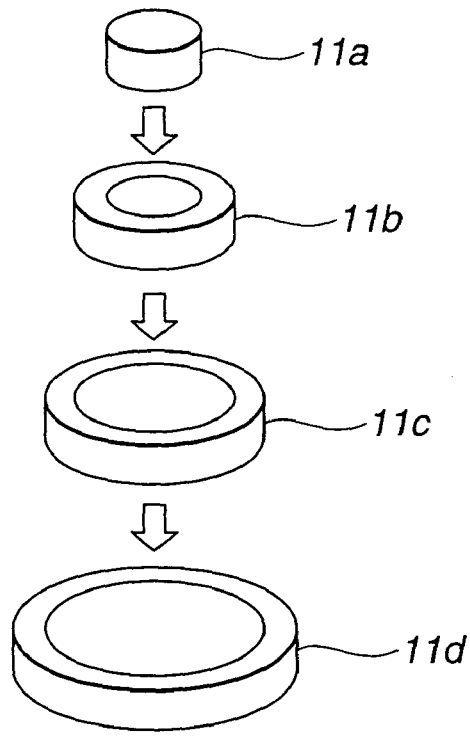
FIG. 2 is an illustration showing a pressed compact.

In particular, as shown in FIG. 2, for example, the lead niobate A powder material is pressed to form a cylindrical pressed compact 11a having a diameter of 2 mm, and the powder mixture containing the lead niobate A powder material and the lead titanate B powder material in the ratio of two to one is pressed to form a ring-shaped pressed compact 11b having an outside diameter of 4 mm and an inside diameter of 2 mm. Furthermore, the powder mixture containing the lead niobate A powder material and the lead titanate B powder material in the ratio of one to two is pressed to form a ring-shaped pressed compact 11c having an outside diameter of 6 mm and an inside diameter of 4 mm, and the lead titanate B powder material is pressed to form a ring-shaped pressed compact 11d having an outside diameter of 8 mm and an inside diameter of 6 mm.

Figure 3:
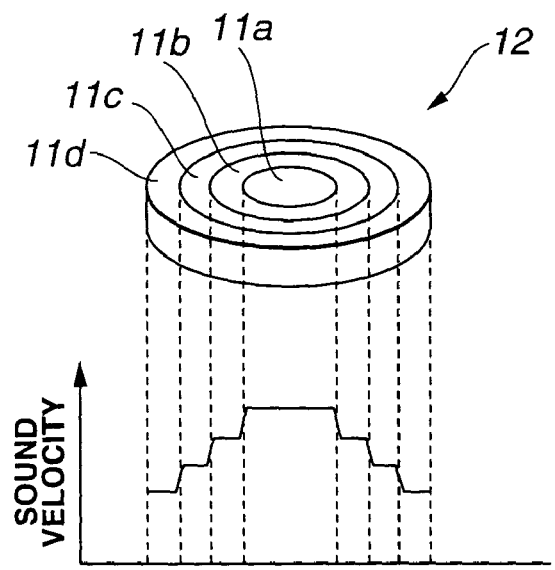
FIG. 3 is an illustration showing the distribution of sound velocity in a sintered compact.

These ring-shaped pressed compacts 11a to 11d are fitted into each other to form a disk composite structure, and this composite structure is then placed in the sintering die 3 of the spark plasma sintering system 1 shown in FIG. 1. A pulsed electric current is applied between the press punches 5 to perform rapid heating while the composite structure is pressed with the press means 2, thereby obtaining a sintered compact 12 having the sound velocity distribution shown in FIG. 3.

In conventional sintering methods, since the sintering reaction time is long, components are diffused during the reaction time to cause a change in characteristic and the composite structure containing materials having different compositions cannot be co-sintered. However, when a rapid heating sinter forging method such as a spark plasma sintering method is used, the diffusion of components can be prevented to readily join different materials together, thereby readily obtaining such a sintered compact having a composition gradient and desired functions.

In this case, a method for manufacturing the sintered compact having the composition gradient is not limited to the above procedure in which, after the pressed compacts 11a to 11d are individually prepared, these pressed compacts are mechanically joined together and then subjected to co-sintering. For example, as shown in FIGS. 4 and 5, the following procedure may be employed: press molding is repeatedly performed to prepare pressed compacts having desired shapes and the obtained pressed compacts are subjected to sintering.

Figure 4:
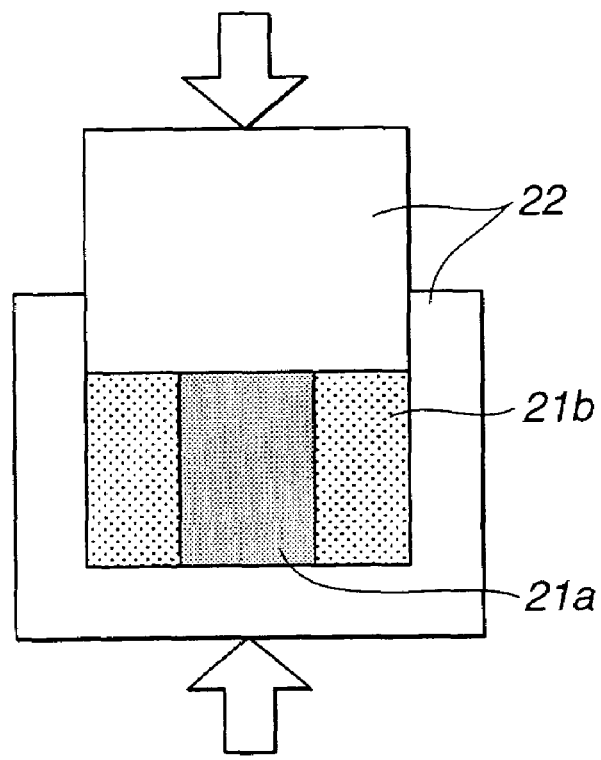
FIG. 4 is an illustration showing press molding.
Figure 5:
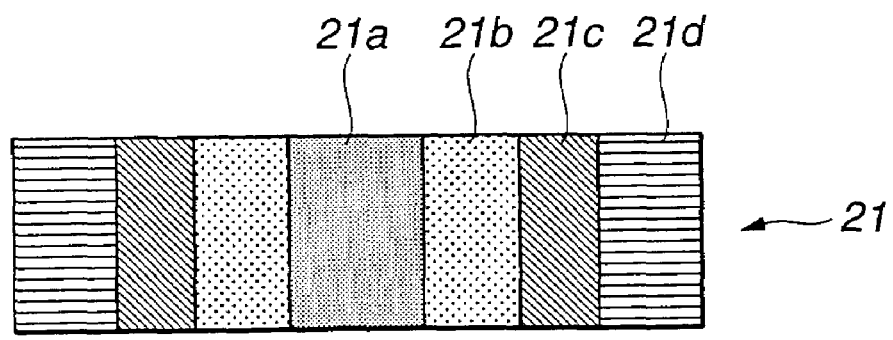
FIG. 5 is an illustration showing the composition distribution of a pressed compact.

That is, as shown in FIG. 4, a pressed compact 21a having a cylindrical shape and a diameter of 2 mm is formed using the lead niobate A powder material, the pressed compact 21a is placed at the center of a press mold 22 having a diameter of 4 mm, the powder mixture containing the lead niobate A powder material and the lead titanate B powder material in the ratio of two to one is placed around the pressed compact 21a to press them, thereby obtaining another pressed compact 21b in which the powder mixture containing the lead niobate A powder material and the lead titanate B powder material in the ratio of two to one is disposed around the pressed compact 21a. In the same manner as the above, another pressed compact 21c is formed using the powder mixture containing the lead niobate A powder material and the lead titanate B powder material in the ratio of one to two, and another pressed compact 21d is formed using the lead titanate B powder material, thereby obtaining another pressed compact 21 having a desired shape, as shown in FIG. 5. The pressed compact 21 is placed in the sintering die 3 of the spark plasma sintering system 1 and then subjected to sintering by rapid heating in an oxygen atmosphere.

For a sintered compact having such a composition gradient, the size and composition are not limited to the above instances, and piezoelectric materials and electrostrictive materials that have different sound velocity characteristics and can be sintered by rapid heating, for example, by a spark plasma sintering method, may be used. The pattern of the composition gradient is not limited to a concentric shape. The composition may be varied in one direction in the same manner as in a square sintered compact 31 shown in FIG. 6. Two or more materials, in which the sound propagation velocity is different from each other, may be joined together to form a functional gradient in the same manner as in a sintered compact 32 shown in FIG. 7.

Figure 6:
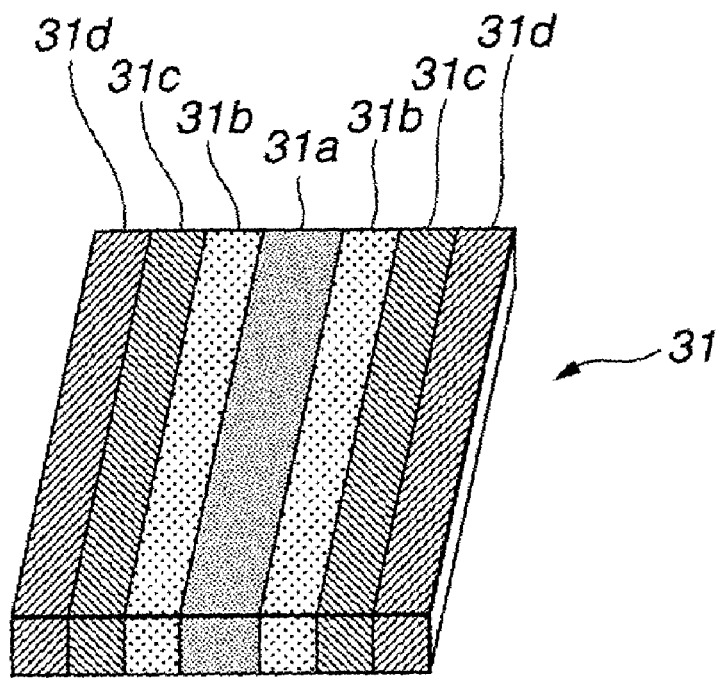
FIG. 6 is an illustration showing a composition gradient varied in one direction.

The square sintered compact 31 shown in FIG. 6 is formed by co-sintering a plurality of narrow materials having different sound velocity characteristics and a square cross section. In the sintered compact 31, a material 31a having a large sound propagation velocity is disposed at the center and materials 31b, 31c, and 31d having a small sound propagation velocity are arranged at both sides of the material 31a in that order, thereby forming a functional gradient varied in one direction along the material arrangement.

Figure 7:
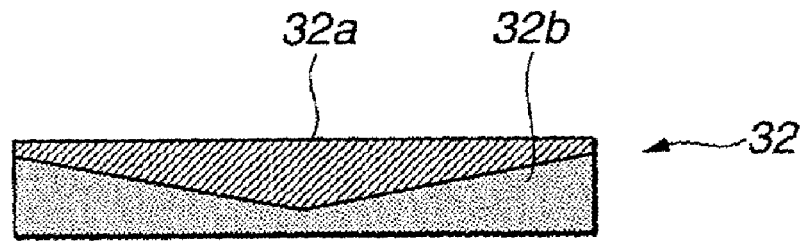
FIG. 7 is an illustration showing a composition gradient varied in the thickness direction.

The sintered compact 32 shown in FIG. 7 is formed by joining a material 32a having a large sound velocity and another material 32b having a small sound velocity together in the thickness direction. The layer of material 32a having a large sound velocity has a larger thickness at the center and the layer of material 32b having a small sound velocity has a smaller thickness at the center. That is, from the center toward the periphery, the layer of material 32a having a large sound velocity is rendered thinner and the layer of material 32b having a small sound velocity is rendered thickener, thereby obtaining a desired functional gradient.

Next, the sintered compact 12 obtained according to the above procedure is cut into pieces having a predetermined thickness (for example, 100 μm), and each piece is surface-ground (polished) such that an ultrasonic radiating face is in parallel to the back face of the ultrasonic radiating face, thereby preparing a transducer. First electrode layers containing chromium or nickel are each provided on both corresponding faces of the polished transducer and second electrode layers containing gold are each provided on the corresponding first electrode layers with a sputtering system (not shown). The first electrode layers containing chromium or nickel function as a binder for enhancing the bonding strength between the sintered compact and gold, and the second electrode layers formed by sputtering gold are used for readily performing wire-bonding.

Figure 8:
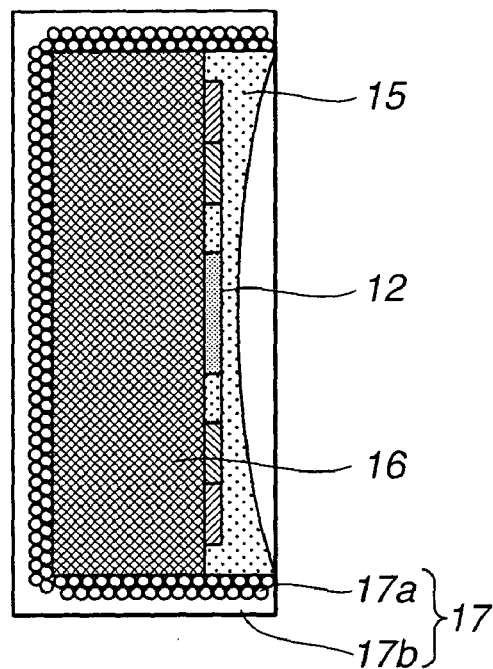
FIG. 8 is an illustration showing a configuration of a transducer.
Figure 9:
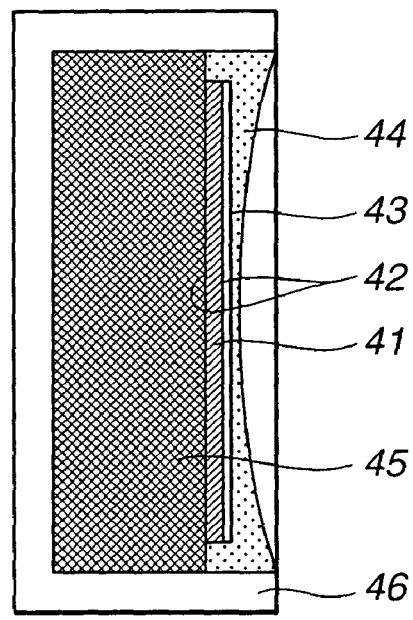
FIG. 9 is an illustration showing a configuration of a conventional ultrasonic transducer.
Figure 10:
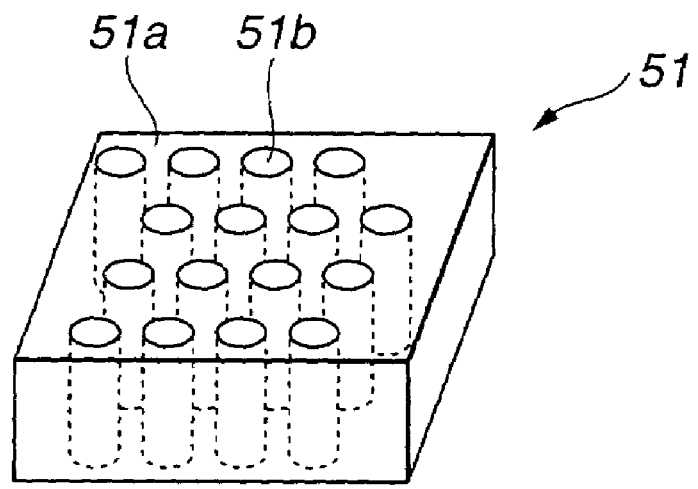
FIG. 10 is an illustration showing a conventional ultrasonic transducer comprising a composite piezoelectric material.
Figure 11:
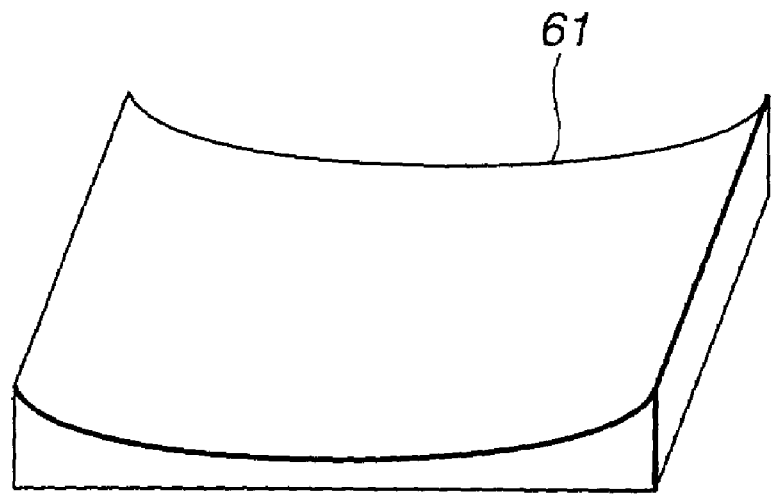
FIG. 11 is an illustration showing a conventional ultrasonic transducer comprising a piezoelectric material having a thickness gradient.

As shown in FIG. 8, an acoustic lens 15 in which the thickness of the center is smaller than that of the periphery is formed at the side of the acoustic radiating face (ultrasonic radiating face) of the transducer. In the acoustic lens 15, the curvature of the front face is designed such that the thickness of each portion is equal to substantially one fourth of the fundamental frequency λ of the transducer comprising the sintered compact. The acoustic lens 15 also functions as an acoustic matching layer. In this configuration, a single layer functioning as both an acoustic lens and an acoustic matching layer is used. However, two or more layers function as such an acoustic lens and acoustic matching layer may be formed. In this case, after the matching layer designed based on the fundamental frequency of each portion is formed, the acoustic lens may be placed such that the focus is formed at a desired position. Thus, the focus position can be readily designed.

A backing layer 16 is provided on the back face of the transducer and this structure is placed in a housing 17 having a large number of cavities disposed on the inside faces thereof. The housing 17 includes spherical porous sintered compacts 17a disposed on the inside faces thereof and a dense stainless sintered compact 17b disposed on the outside, wherein the spherical porous sintered compacts 17a are formed by a spark plasma sintering method using minute metal beads. The spherical porous sintered compacts 17a disposed on the inside faces of the housing 17 have a function of diffusing echoes reflected in the housing 17.

That is, in conventional ultrasonic transducers, in order to reduce ultrasonic echoes, reflected from a housing through a backing layer, to a negligible level, the backing layer must have a large thickness and this prevents the miniaturization of such ultrasonic transducers. However, when the housing 17 having a large number of cavities disposed on the inside faces thereof is used, reflected ultrasonic echoes can be diffused. Thus, the reflected echoes can be reduced to a sufficiently small level even if the backing layer 16 has a small thickness, thereby allowing the miniaturization.

As described above, in this embodiment, a material having a large sound propagation velocity arranged at the center, materials having a smaller sound propagation velocity are arranged toward the periphery in descending order, these materials are formed into a monolithic structure by a rapid heating sintering method, and an ultrasonic radiating face and the back face of the ultrasonic radiating face are surface-ground (polished), thereby obtaining an ultrasonic transducer in which the resonant frequency varies depending on portions thereof.

That is, the ultrasonic transducer is finished by a simple process in which the content and materials are varied to vary the composition gradient to vary the sound velocity characteristics and the ultrasonic radiating face is surface-ground (polished). Therefore, a special processing procedure such as the formation of a thickness gradient is not necessary, wherein such a procedure is necessary for manufacturing conventional plano-concave transducers. Thus, a transducer having the following structure can be readily manufactured at low cost: the center portion transmits or/and receives high-frequency ultrasonic waves and the periphery portion transmits or/and receives low-frequency ultrasonic waves, the frequency of the ultrasonic waves being gradually lowered from the center toward the periphery.

When ultrasonic probes for ultrasonic diagnostic equipment include such a transducer, high-frequency ultrasonic waves are transmitted/received at the center region having a small aperture and low-frequency ultrasonic waves are transmitted/received at other regions having a large aperture in a single transducer. Thus, tissues in shallow areas can be observed with high resolution using high-frequency ultrasonic waves, and ultrasonic images of sufficiently deep areas can be obtained using low-frequency ultrasonic waves without deteriorating the (directional) resolution in deep areas.

In the above embodiment, the transducer including a single disk is illustrated. However, the present invention is not limited to the embodiment. The same advantages as in the above can be obtained using a transducer including a single square plate and an array transducer.

In the present invention, it is clear that various embodiments based on the present invention may be made in various applications within the spirit and scope of the present invention. The present invention is not limited to particular embodiments except for the accompanying claims.

What is claimed is:
1. An ultrasonic transducer comprising:
material compositions arranged from the periphery toward the center in ascending order of sound velocity such that the frequency of ultrasonic waves radiated from regions is varied depending on the regions; and
an ultrasonic wave-radiating face that is in parallel to the back face thereof.
2. An ultrasonic transducer comprising:
an ultrasonic wave-radiating face including materials that have different compositions and are arranged from the periphery toward the center of the ultrasonic wave-radiating face in ascending order of sound propagation velocity,
wherein the ultrasonic wave-radiating face and the back face facing the ultrasonic wave-radiating face are polished so as to be in parallel to each other.

* * * * *